United States Patent [19]

Hunt et al.

[11] Patent Number: 5,986,970
[45] Date of Patent: Nov. 16, 1999

[54] METHOD, ARCHITECTURE AND CIRCUIT FOR WRITING TO A MEMORY

[75] Inventors: Jeffery Scott Hunt, Ackerman, Miss.; Sudhaker Reddy Anumula, Sunnyvale, Calif.; Ajay Srikrishna, Starkville, Miss.; Jeffrey W. Waldrip, Starkville, Miss.; Satish C. Saripella, Starkville, Miss.

[73] Assignee: Cypress Semiconductor Corp., San Jose, Calif.

[21] Appl. No.: 09/106,806

[22] Filed: Jun. 29, 1998

[51] Int. Cl.⁶ ............................................. G11C 7/00
[52] U.S. Cl. ................ 365/233.5; 365/233; 365/230.08; 365/189.05
[58] Field of Search ..................... 365/230.01, 189.01, 365/233, 233.5, 230.08, 189.05

[56] References Cited

U.S. PATENT DOCUMENTS

| | | | |
|---|---|---|---|
| 4,825,416 | 4/1989 | Tam et al. | 365/194 |
| 5,058,076 | 10/1991 | Kiuchi | 365/230.01 |
| 5,193,076 | 3/1993 | Houston | 365/233.5 |
| 5,291,447 | 3/1994 | Kodama et al. | 365/190 |
| 5,309,395 | 5/1994 | Dickinson et al. | 365/189.04 |
| 5,325,337 | 6/1994 | Buttar | 365/210 |
| 5,388,075 | 2/1995 | Vinal | 365/189.05 |
| 5,394,361 | 2/1995 | Dickinson | 365/189.04 |
| 5,473,565 | 12/1995 | Kusakari | 365/189.01 |
| 5,473,568 | 12/1995 | Okamura | 365/210 |
| 5,479,374 | 12/1995 | Kobayashi et al. | 365/233.5 |
| 5,502,672 | 3/1996 | Kwon | 365/189.05 |
| 5,502,681 | 3/1996 | Park | 365/210 |
| 5,544,101 | 8/1996 | Houston | 365/189.02 |
| 5,559,752 | 9/1996 | Stephens, Jr. et al. | 365/233 |
| 5,568,073 | 10/1996 | Mcclure | 327/51 |
| 5,596,539 | 1/1997 | Passow et al. | 365/210 |
| 5,604,705 | 2/1997 | Ackland et al. | 365/205 |
| 5,610,862 | 3/1997 | Teel | 365/189.05 |
| 5,625,595 | 4/1997 | Ikeda | 365/194 |
| 5,631,866 | 5/1997 | Oka et al. | 365/189.05 |
| 5,644,773 | 7/1997 | DiMarco | 395/750 |
| 5,659,513 | 8/1997 | Hirose et al. | 365/205 |
| 5,661,417 | 8/1997 | Kondoh | 365/87 |
| 5,661,691 | 8/1997 | Lin | 365/208 |
| 5,666,321 | 9/1997 | Schaefer | 365/233.5 |
| 5,703,831 | 12/1997 | Sawada | 365/233 |
| 5,717,653 | 2/1998 | Suzuki | 365/233 |
| 5,724,287 | 3/1998 | Takenaka | 365/191 |
| 5,729,503 | 3/1998 | Manning | 365/233.5 |
| 5,742,552 | 4/1998 | Greenberg | 365/210 |
| 5,745,419 | 4/1998 | Brauch | 365/201 |
| 5,748,544 | 5/1998 | Hashimoto | 365/201 |
| 5,751,170 | 5/1998 | Pyeon | 327/57 |
| 5,751,647 | 5/1998 | O'Toole | 365/200 |
| 5,752,270 | 5/1998 | Wada | 711/169 |
| 5,754,481 | 5/1998 | Yabe et al. | 365/189.05 |
| 5,757,718 | 5/1998 | Suzuki | 365/233.5 |
| 5,761,136 | 6/1998 | Park et al. | 365/191 |
| 5,822,254 | 10/1998 | Koshikawa et al. | 365/189.05 |
| 5,844,849 | 12/1998 | Furutani | 365/194 |

OTHER PUBLICATIONS

Jeffrey S. Hunt et al., U.S.S.N. 09/107,000 Method, Architecture and Circuit for Writing to and Reading From a Memory During a Single Cycle, filed Jun. 29, 1998.

Jeffrey S. Hunt et al., U.S.S.N. 09/132,100 Method, Architecture and Circuit for Reducing and/or Eliminating Small Signal Voltage Swing Sensitivity, filed Aug. 10, 1998.

Satish Saripella et al., U.S.S.N. 09/126,832 Worldline Synchronized Reference Voltage Generator, filed Jul. 31, 1998.

Jeffrey S. Hunt et al., U.S.S.N. 09/103,960 Self–Timed Sense Amplifier Evaluation Scheme, filed Jun. 24, 1998.

*Primary Examiner*—Viet Q. Nguyen
*Attorney, Agent, or Firm*—Christopher P. Maiorana, P.C.

[57] ABSTRACT

A circuit and method comprising a memory, a first latch, a second latch and a control circuit. The memory may be configured to write information in response to (i) an input data signal and (ii) an address signal. The first latch may be configured to hold the address in response to a control signal. The second latch may be configured to hold the data input signal in response to the control signal. The control circuit may be configured to present the control signal in response to (i) a detect signal and (ii) a transition of the address signal.

14 Claims, 4 Drawing Sheets

METHOD, ARCHITECTURE AND CIRCUIT FOR WRITING TO A MEMORY

FIELD OF THE INVENTION

The present invention relates to memories generally and, more particularly, to a method, architecture and circuit for writing to a memory.

BACKGROUND OF THE INVENTION

A conventional approach to writing to a memory responds to each data change and each address change when writing to the memory array. Pulsed wordline approaches reduce current significantly when writing to and reading from memories. If the data is written to the memory array, and then either the address or the data changes states, new data is written. Each time the data or the address changes state, the new data is written to the memory array. For each data change, current is consumed to perform the write operation. Therefore, all data and address changes previous to the final data change consume unnecessary current. This causes the current consumption to be unpredictable during a write cycle.

Referring to FIG. 1, a circuit 10 is shown implementing a conventional pulsed wordline approach for writing to a memory. The circuit 10 generally comprises an address path block 12, a memory array block 14, a sense amplifier block 16, and output path block 18, a write driver block 20, a data transition detect block 22, an address transition detect block 24 and a control block 26. The address path block 12 and the address transition detect block 24 each receive a signal ADDRESS that is an externally generated address presented to the circuit 10. The address path block 12 presents a wordline signal WL to the memory array block 14. The memory array block 14 presents a signal TBUS to the sense amplifier block 16. The sense amplifier block 16 presents a signal SAOUT to the output path block 18. The output path block 18 presents a signal IO that may be presented to the external pins of the circuit 10. The signal IO is also presented to the write driver block 20 and the data transition detect block 22. The write driver block 20 presents data to the memory array block 14 and the sense amplifier block 16 receives data from the memory array block 14. The data transition detect block 22 presents a data transition detect signal DTD to the control block 26. The address transition detect block 24 presents an address transition detect signal ATD to the control block 26. The control block 26 also receives an external write enable signal WEB. The control block 26 also receives a signal WLDET from the memory array block 14. The control block 26 presents a signal WLEN to the address path block 12 and a signal SAEN to the sense amplifier block 16.

Referring to FIG. 2, a timing diagram illustrating the various signals of FIG. 1 is shown, where the signal WEB is equal to a "0". The signal ADDRESS has a transition 30. The signal ATD has a positive transition 32 that responds to the transition 30 of the signal ADDRESS. The signal WLEN has a positive transition 34 that responds to the negative transition 32 of the signal ATD. The signal WL has a positive transition 36 that responds to the positive transition 34 of the signal WLEN. The signal WLDET has a positive transition 38 that responds to the positive transition 36 of the signal WL. The signal TBUS has a transition 40 that responds to the positive transition 38 of the signal WLDET. The signal IO has a transition 42 and 44 that each indicate a change in the data has occurred.

The signal WLEN has a negative transition 48 that responds to the positive transition 38 of the signal WLDET. The signal WL has a negative transition 50 that responds to the negative transition 48 of the signal WLEN. The signal WLDET has a negative transition 52 that responds to the negative transition 50 of the signal WL. The signal TBUS has a transition 54 that responds to the negative transition 52 of the signal WLDET. The signal DTD has a positive transition 46 that responds to the transition 42 of the signal IO. The signal WLEN has a positive transition 56 that responds to the positive transition 46 of the signal DTD. The signal WL has a positive transition 58 that responds to the positive transition 56 of the signal WLEN. The signal WLDET has a positive transition 60 that responds to the positive transition 58 of the signal WL. The signal TBUS has a transition 62 that responds to the positive transition 60 of the signal WLDET. The signal WLEN has a negative transition 64 that responds to the positive transition 60 of the signal WLDET. The signal WL has a negative transition 66 that responds to the negative transition 64 of the signal WLEN. The signal WLDET has a negative transition 68 that responds to the negative transition 66 of the signal WL. The signal TBUS has a transition 70 that responds to the negative transition 68 of the signal WLDET.

The signal DTD has a positive transition 72 that responds to the transition 44 of the signal IO. The signal WLEN has a positive transition 74 that responds to the positive transition 72 of the signal DTD. The signal WL has a positive transition 76 that responds to the positive transition 74 of the signal WLEN. The signal WLDET has a positive transition 78 that responds to the positive transition 76 of the signal WL. The signal TBUS has a positive transition 80 that responds to the positive transition 78 of the signal WLDET. The signal WLEN has a negative transition 82 that responds to the positive transition 78 of the signal WLDET. The signal WL has a negative transition 84 that responds to the negative transition 82 of the signal WL. The signal WLDET has a negative transition 86 that responds to the negative transition 84 of the signal WL. The signal TBUS has a transition 88 that responds to the negative transition 86 of the signal WLDET.

The transition 44 indicates that stable data is ready to be written to the memory array block 14. Once a stable data transition 44 occurs, the transition 72–88 write the correct data to the memory array block 14. The signal ATD has a positive transition 32' that responds to a transition 30' of the signal ADDRESS. The transition 32' triggers the writing transitions 34'–54' that may or may not be valid transitions, depending on the state of the signal IO.

SUMMARY OF THE INVENTION

The present invention concerns a circuit and method comprising a memory, a first latch, a second latch and a control circuit. The memory may be configured to write information in response to (i) an input data signal and (ii) an address signal. The first latch may be configured to hold the address in response to a control signal. The second latch may be configured to hold the data input signal in response to the control signal. The control circuit may be configured to present the control signal in response to (i) a transition of the address signal and (ii) a detect signal.

The objects, features and advantages of the present invention include providing a circuit that may write to a memory array in response to an address transition that may (i) avoid unnecessary repetitive writings to the memory array and (ii) reduce the overall current used by the circuit.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
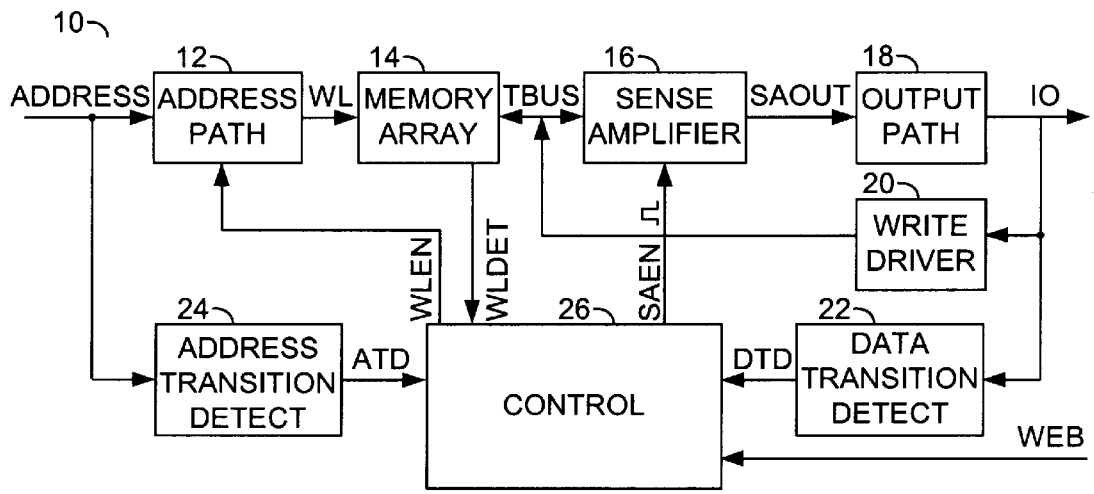
FIG. 1 is a block diagram of a conventional pulsed wordline approach to writing to a memory.
Figure 2:
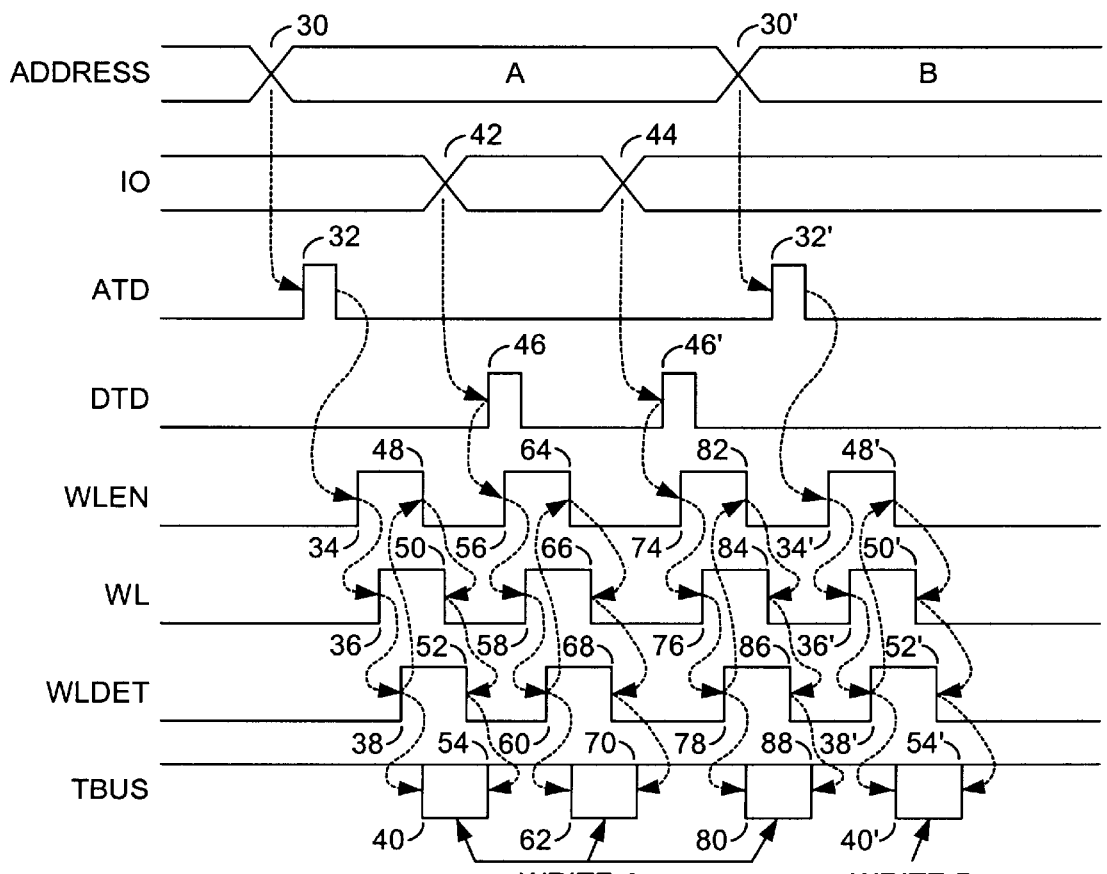
FIG. 2 is a timing diagram of the various signals of FIG. 1.
Figure 3:
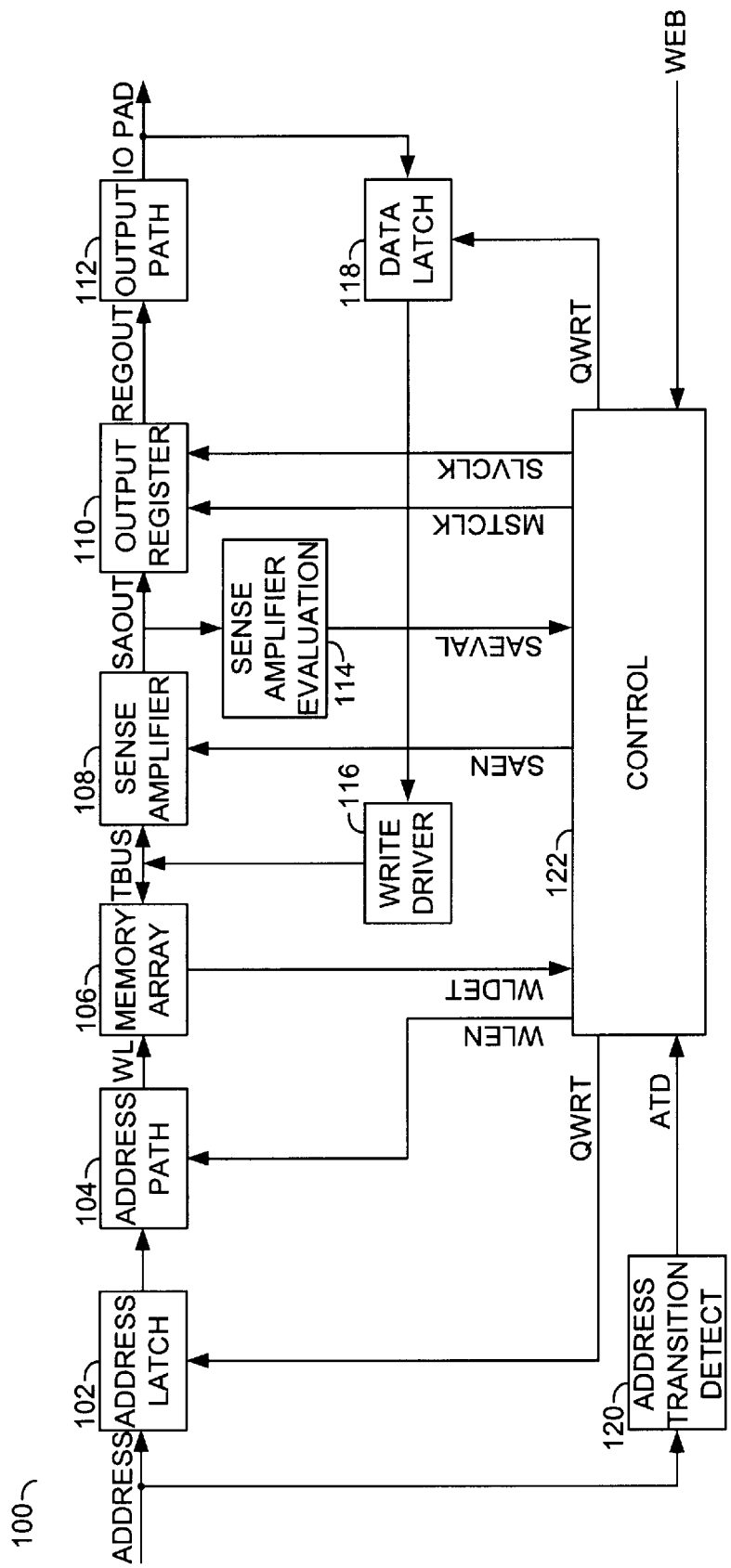
FIG. 3 is a block diagram of the preferred embodiment of the present invention.

Referring to FIG. 3, a block diagram of a circuit 100 is shown in accordance with a preferred embodiment of the present invention. The circuit 100 generally comprises an address latch block (or circuit) 102. An address path block (or circuit) 104, a memory array block (or circuit) 106, a sense amplifier block (or circuit) 108, an output register block (or circuit) 110, an output path block (or circuit) 112, a sense amplifier evaluation block (or circuit) 114, a write driver block (or circuit) 116, a data latch block 118, an address transition detect block (or circuit) 120 and a control block (or circuit) 122.

The address latch block 102 and the address transition detect block 120 may receive a signal (e.g., ADDRESS) that may be an externally generated address signal. The address latch block 102 may hold the previous state of the signal ADDRESS for an amount of time determined by the control block 102 before presenting the new state of the signal ADDRESS to the address path block 104. The address path block 104 may present a signal WL to the memory array block 106. The memory array block 106 may present a signal (e.g., TBUS) to the sense amplifier block 108. The sense amplifier block 108 may present a signal (e.g., SAOUT) to the output register block 110 and the sense amplifier evaluation block 114. The output register block 110 may present a signal (e.g., REGOUT) to the output path block 112. The output path block 112 may present a signal (e.g., IO) to the data latch block 118 as well as to circuitry external to the circuit 100. The data latch block 118 may hold the signal IO in response to a control signal (e.g., QWRT) that may be generated by the control block 122 before presenting the signal IO to the write driver block 116. The write driver block 116 may present the signal IO to the memory array block 106 to write data and the sense amplifier block 108 may read data from the memory array block 106. The address detection block 120 presents an address transition signal (e.g., ATD) to the control block 122. The sense amplifier evaluation block 114 may present a signal (e.g., SAEVAL) to the control block 122. An example of the sense amplifier evaluation block 114 may be found in co-pending application, attorney docket number 0325.00177, filed on Jun. 23, 1998, which is hereby incorporated by reference in its entirety.

The memory array block 106 may present a signal (e.g., WLDET) to the control block 122. The control block 122 may present the control signal QWRT to the data latch block 118, to the address latch block 102 and to the write driver block 116. The control block 122 may also present an enable signal (e.g., SAEN) to the sense amplifier block 108 and a control signal (e.g., MSTCLK) and a control signal (e.g., SLVCLK) to the output register block 110. An example of the generation of the signals MSTCLK and SLVCLK may be found in co-pending application, attorney docket number 0325.00175, filed on Jun. 25, 1998, which is hereby incorporated by reference in its entirety.

Figure 4:
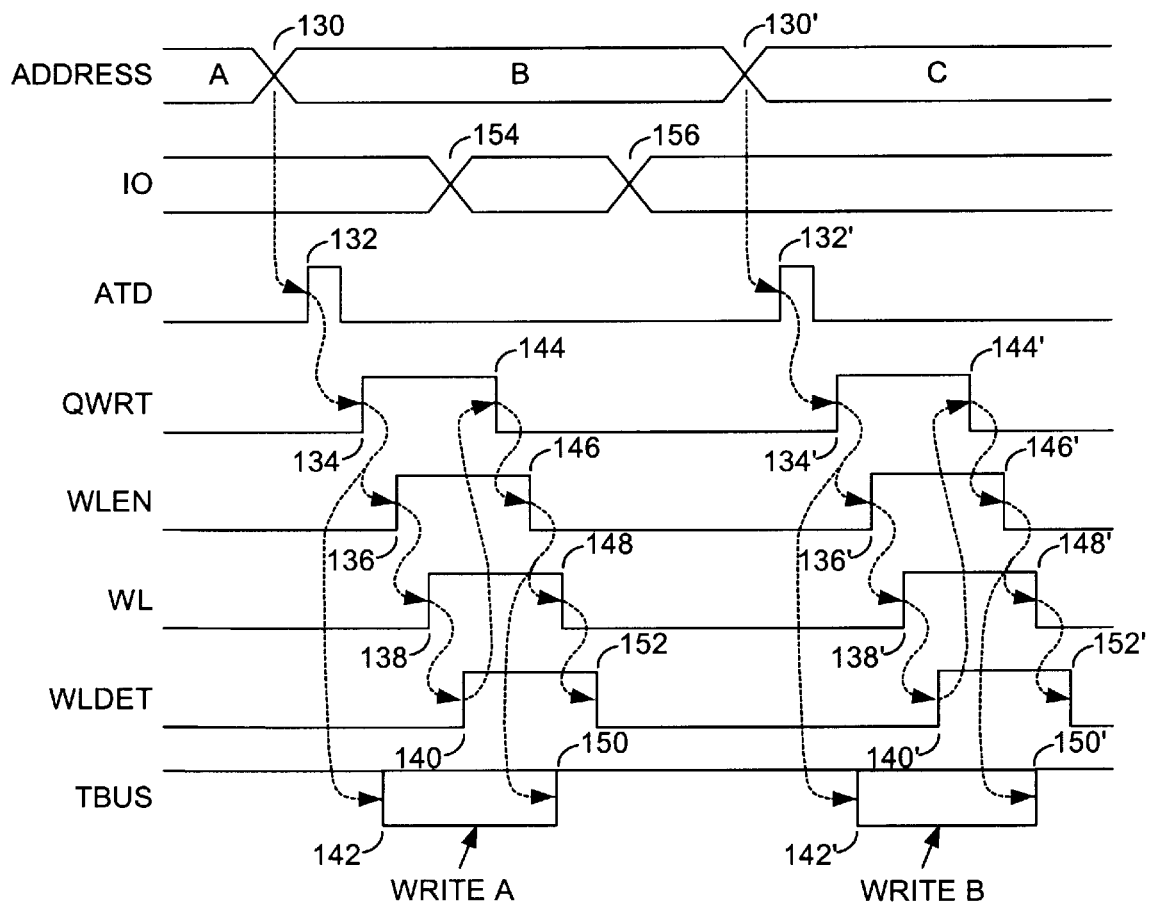
FIG. 4 is a timing diagram of the various signals of FIG. 3.

Referring to FIG. 4, a timing diagram of the various signals of FIG. 3 is shown. The signal ADDRESS may have a transition 130. The signal ATD may have a positive transition 132 that generally responds to the transition 130 of the signal ADDRESS. The signal QWRT may have a positive transition 134 that generally responds to the positive transition 132 of the signal ATD. The signal WLEN may have a positive transition 136 that generally responds to the positive transition 134 of the signal QWRT. The signal WL may have a positive transition 138 that generally responds to the positive transition 136 of the signal WLEN. The signal WLDET may have a positive transition 140 that generally responds to the positive transition 138 of the signal WL. The signal TBUS may have a transition 142 that generally responds to the positive transition 134 of the signal QWRT. The signal QWRT may have a negative transition 144 that may respond to the positive transition 144 of the signal WLDET. The signal WLEN may have a negative transition 146 that may respond to the negative transition 144 of the signal QWRT. The signal WL may have a negative transition 148 that generally responds to the negative transition 146 of the signal WLEN. The signal TBUS may have a transition 150 that generally responds to the negative transition 146 of the signal WLEN. The signal WLDET may have a negative transition 152 that generally responds to the negative transition 148 of the signal WL.

The signal IO may have a transition 154 and a transition 156. The transitions 154 and 156 do not generally affect the operation of the signals QWRT, WLEN, WL, WLDET and TBUS since the signal QWRT generally responds to the signal ATD. The signal QWRT, WLEN, WL, WLDET and TBUS may also have transitions 132', 134', 136', 138', 140', 142', 144', 146', 148', 150' and 152' that generally represent a second writing to the memory array block 106, that generally responds to the transition 130' of the signal ADDRESS.

Since the write operation is generally initiated when the signal ADDRESS has a transition (e.g., the transition 130 or 130'), unnecessary duplicative writes are not performed, which may eliminate unnecessary current consumption. Therefore, only one write operation is generally performed for each address transition allowing predictable current consumption during write.

Figure 5:
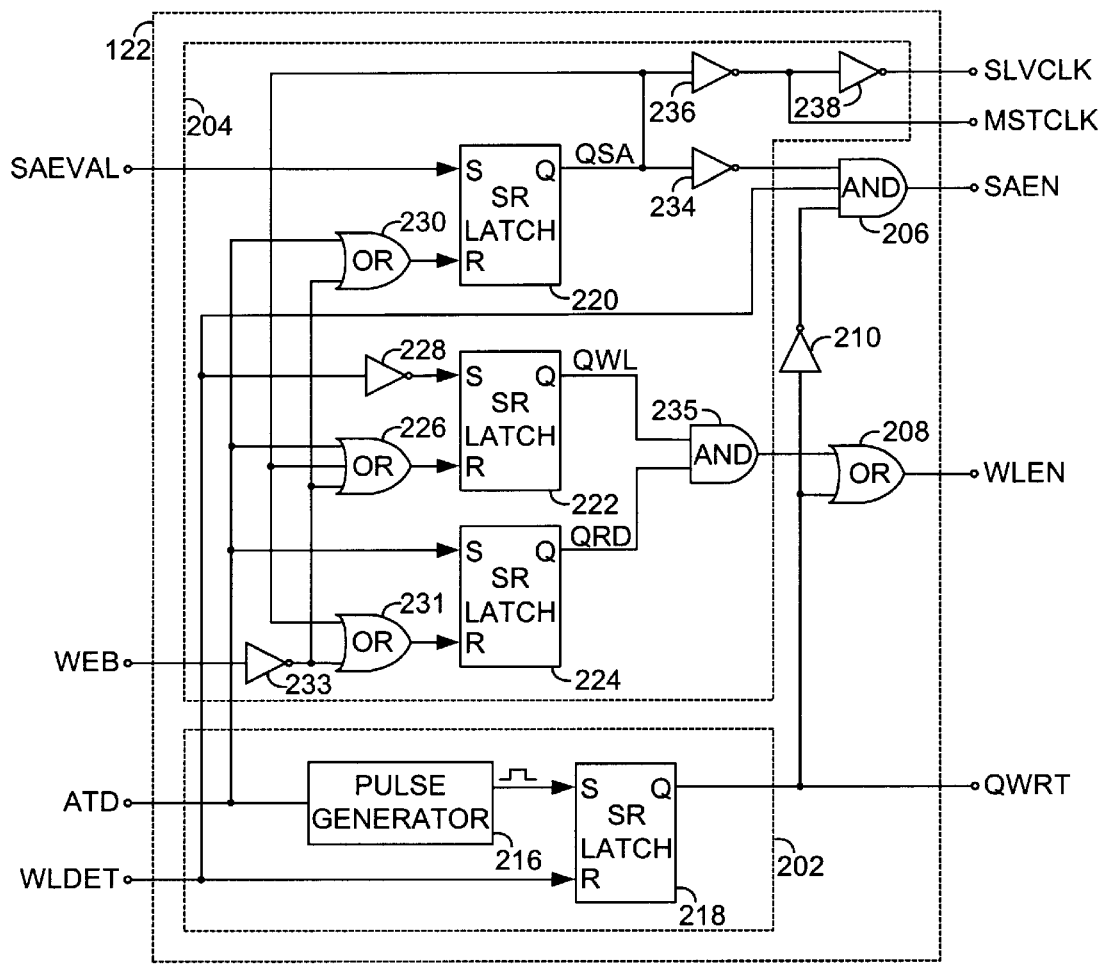
FIG. 5 is a block diagram of the control block of FIG. 3.

Referring to FIG. 5, a more detailed diagram of the control block 122 is shown. The control block 122 generally comprises a write portion 202, a read portion 204, a logic gate 206, a logic gate 208, and an inverter 210. In one example, the logic gate 206 may be implemented as an AND gate and the logic gate 208 may be implemented as an OR gate. The write portion 202 generally comprises a pulse generator 216 and a latch 218. The latch 218 may be implemented, in one example, as a set-reset latch. The pulse generator may receive the signal ATD. The pulse generator 216 may present a pulse to the set input of the latch 218. The latch 218 may have a reset input that may receive the signal WLDET. The latch 218 may present the control signal QWRT.

The read section 204 generally comprises a latch 220, a latch 222, a latch 224, a gate 226, an inverter 228, a gate 230, a gate 231, an inverter 233, an inverter 234, a logic gate 235, an inverter 236 and an inverter 238. The latches 220, 222 and 224 may be implemented, in one example, as set-reset latches. The latch 220 may have a set input that may receive the signal SAEVAL and a reset input that may receive a signal from the gate 230. The latch 220 may present an output signal (e.g., QSA). The gate 226, the gate 230 and the gate 231 may be implemented, in one example, as OR gates. The gate 235 may be implemented, in one example, as an AND gate. The gate 230 has one input that may receive the signal WEB, through the inverter 233, and another input that may receive the signal ATD. The latch 222 may have a set input that may receive the signal WLDET, through the inverter 228, and a reset input that may receive a signal from the gate 226. The gate 226 has one input that may receive the signal ATD, another input that may receive the signal QSA from the latch 220, and a third input that may receive the signal WEB through the inverter 233. The latch 222 may present an output signal (e.g., QWL). The latch 224 has a set input that may receive the signal ATD and a reset input that may receive a signal from the gate 231. The gate 231 has one input that may receive the signal QSA from the latch 220 and another input that may receive the signal WEB, through the inverter 233. The latch 224 may present an output signal (e.g., QRD). The gate 206 may have one input that may receive the signal QSA through the inverter 234, another input that may receive the signal WLDET and a third input that may receive the signal from the output of the latch 218, through the inverter 210. The output of the latch 218 may also be presented to the gate 208. The gate 235 has one input that may receive the signal QWL and another input that may receive the signal QRD. The gate 235 may present a signal to the gate 208.

Figure 6:
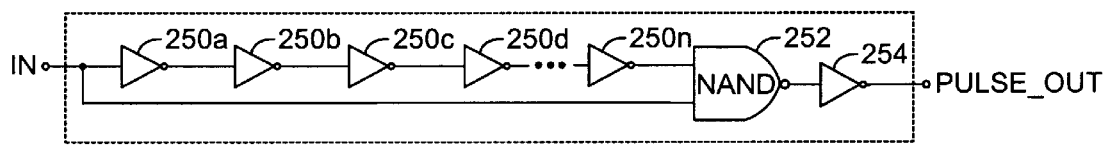
FIG. 6 is a circuit diagram of the pulse generator of FIG. 5.

Referring to FIG. 6, a circuit diagram of the pulse generator 216 is shown. The pulse generator 216 generally comprises a number of inverters 250a–250n, a gate 252 and an inverter 254. The gate 252 may be implemented, and in one example, as a NAND gate. The pulse generator 216 generally presents a signal (e.g., PULSE_OUT) in response to the signal (e.g., IN) received from the OR gate 214.

Figure 7:
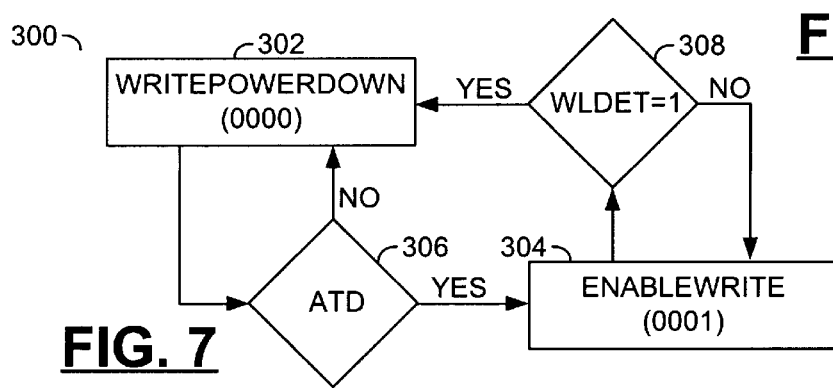
FIG. 7 is a flow diagram illustrating the operation of the control block of the circuit of FIG. 5.

Referring to FIG. 7, a flow diagram 300 illustrating the functioning of the circuit of FIG. 5 is shown where an external write enable signal (e.g., WEB) may be a "0". The flow diagram 300 generally comprises a state 302 (e.g., WRITEPOWERDOWN) and a state 304 (e.g., ENABLEWRITE). Each of the states 302 and 304 has a multi-bit word that represents the output of the latches 218–224. The first bit generally represents the output of the latch 220, the second bit generally represents the output of the latch 222, the third bit generally represents the output of the latch 224, and the fourth bit generally represents the output of the latch 218. More specifically, when in the state 304, the multi-bit word (e.g., 0001) generally indicates that the latch 218 is presenting a digital "1" and the latches 220, 222 and 224 are each presenting a digital "0".

When in the state 302, the logic 300 generally waits for an address transition, generally represented by the block 306. If an address transition detect does not occur, the logic 300 stays in the state 302. If an address transition detect does occur, the logic proceeds to the state 304. When in the state 304, the logic 300 evaluates the state of the signal WLDET, as represented by the block 308. If the signal WLDET equals "1", the logic generally returns to the state 302. If the signal WLDET does not equal "1", the logic returns to the state 304.

A more detailed flow diagram 300 illustrating transitions of an external write enable signal may be found in co-pending application, attorney docket number 0325.00173, filed on Jun. 29, 1998, which is hereby incorporated by reference in its entirety.

While the invention has been particularly shown and described with reference to the preferred embodiments thereof, it will be understood by those skilled in the art that various changes in form and details may be made without departing from the spirit and scope of the invention.

We claim:
1. A circuit comprising:
   a memory configured to write information in response to (i) an input data signal and (ii) an address signal;
   a first latch circuit configured to hold said address signal for a predetermined time in response to a control signal;
   a second latch circuit configured to hold said input data signal for a predetermined time in response to said control signal; and
   a control circuit configured to present said first control signal in response to (i) a transition of said address signal and (ii) a detect signal.
2. The circuit according to claim 1, wherein said transition of said address signal generates an address transition detect signal.
3. The circuit according to claim 1, wherein said detect signal comprises a wordline detect signal.
4. The circuit according to claim 1, wherein said control circuit comprises a third latch configured to generate said control signal.
5. The circuit according to claim 4, wherein said third latch generates said control signal in response to said transition of said address signal.
6. The circuit according to claim 1, wherein said control signal has (i) a first state that enables said first latch to hold said address signal and said second latch to hold said input data signal and (ii) a second state that enables said first latch to present said address signal and said second latch to present said data signal.
7. The circuit according to claim 1, further comprising a write driver circuit configured to write said information to said memory in response to said control signal.
8. A circuit comprising:
   means for writing information in response to (i) an input data signal and (ii) an address signal;
   means for holding said address signal for a predetermined time in response to a control signal;
   means for holding said data input signal for a predetermined time in response to said control signal; and
   means for presenting (i) said first control signal in response to (i) a transition of said address signal and (ii) a detect signal.
9. A method for writing to a memory comprising the steps of:
   (A) writing information in response to (i) an input data signal and (ii) an address signal;
   (B) holding said address signal for a predetermined time in response to a control signal;
   (C) holding said input data signal for a predetermined time in response to said control signal; and
   (D) presenting (i) said first control signal in response to (i) a transition of said address signal and (ii) a detect signal.
10. The method according to claim 9, wherein said transition of said address signal generates an address transition detect signal.
11. The method according to claim 9, wherein said detect signal comprises a wordline detect signal.
12. The method according to claim 9, wherein step (B) generates said control signal in response to a third latch.

13. The method according to claim 9, wherein step (B) generates said control signal in response to said transition of said address signal.

14. The method according to claim 9, wherein said control signal has one of (i) a first state that enables step (B) to hold said address signal and step (C) to hold said data signal or (ii) a second state that enables step (B) to present said address signal and said step (C) to present said data signal.

* * * * *